United States Patent
Dubey et al.

(10) Patent No.: US 11,733,512 B2
(45) Date of Patent: Aug. 22, 2023

(54) SENSOR HAVING A WIRELESS HEATING SYSTEM

(71) Applicant: Ford Global Technologies, LLC, Dearborn, MI (US)

(72) Inventors: Prashant Dubey, Canton, MI (US); Segundo Baldovino, Novi, MI (US); LaRon Michelle Brown, Detroit, MI (US); Venkatesh Krishnan, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 965 days.

(21) Appl. No.: 16/504,644

(22) Filed: Jul. 8, 2019

(65) Prior Publication Data

US 2021/0011283 A1 Jan. 14, 2021

(51) Int. Cl.
| | |
|---|---|
| *G02B 27/00* | (2006.01) |
| *G01S 7/497* | (2006.01) |
| *H05B 6/10* | (2006.01) |
| *G01S 7/481* | (2006.01) |
| *H10N 10/13* | (2023.01) |
| *F25B 21/02* | (2006.01) |

(52) U.S. Cl.
CPC ........ *G02B 27/0006* (2013.01); *G01S 7/4813* (2013.01); *G01S 7/497* (2013.01); *H05B 6/10* (2013.01); *H10N 10/13* (2023.02); *F25B 21/02* (2013.01); *G01S 2007/4977* (2013.01); *H05B 2214/02* (2013.01)

(58) Field of Classification Search
CPC ..... G02B 27/006; G01S 7/4813; G01S 7/497; G01S 2007/4977; H01L 35/30; H05B 6/10; H05B 2214/02; F25B 21/02

USPC .......................................... 219/635
See application file for complete search history.

(56) References Cited

U.S. PATENT DOCUMENTS

| | | | |
|---|---|---|---|
| 7,965,336 B2 | 6/2011 | Bingle et al. | |
| 8,899,761 B2 | 12/2014 | Tonar et al. | |
| 9,618,828 B2 | 4/2017 | Lang et al. | |
| 10,215,951 B2 | 2/2019 | Park et al. | |
| 2011/0115972 A1 | 5/2011 | Voges | |
| 2014/0246325 A1* | 9/2014 | Tsuchiya | H01L 21/76873 204/192.15 |
| 2014/0287639 A1* | 9/2014 | Lee | H01B 1/22 442/376 |
| 2015/0102025 A1 | 4/2015 | Hirano et al. | |
| 2016/0190850 A1* | 6/2016 | Jeganathan | H02J 50/10 320/108 |
| 2017/0229909 A1* | 8/2017 | Peng | A47G 19/2288 |
| 2018/0210161 A1* | 7/2018 | Park | H04N 5/2257 |
| 2018/0239105 A1 | 8/2018 | Lee et al. | |
| 2018/0338118 A1 | 11/2018 | Dellock et al. | |

(Continued)

FOREIGN PATENT DOCUMENTS

DE 102015111281 A1 1/2017

*Primary Examiner* — Mahmoud S Ismail
(74) *Attorney, Agent, or Firm* — Frank A. MacKenzie; Bejin Bieneman PLC (57) ABSTRACT

A sensor is disclosed. The sensor may comprise: a housing, comprising a transmitting coil; and an optic assembly, comprising a body supporting at least one receiving coil and a conductive film that is in electrical contact with the at least one receiving coil, wherein, when the transmitting coil is energized, the at least one receiving coil is wirelessly energized causing a temperature of the film to increase.

16 Claims, 7 Drawing Sheets

(56) References Cited

U.S. PATENT DOCUMENTS

2019/0025088 A1\* 1/2019 Utermoehlen ....... G01D 5/2086
2020/0200594 A1\* 6/2020 Chen ..................... G03B 17/02
2020/0204712 A1\* 6/2020 Kim .................. G02B 27/0006

\* cited by examiner

SENSOR HAVING A WIRELESS HEATING SYSTEM

BACKGROUND

When a sensor is exposed to an outdoor environment, extreme temperatures and the like can affect sensor performance. For example, under some conditions, ice can build up on a cover of the sensor and thereby block light from entering the sensor and/or obscure imaging.

DETAILED DESCRIPTION

An imaging system is described in detail below that includes at least one sensor. According to one illustrative example, the sensor comprises: a housing, comprising a transmitting coil; and an optic assembly, comprising a body supporting at least one receiving coil and a conductive film that is in electrical contact with the at least one receiving coil, wherein, when the transmitting coil is energized, the at least one receiving coil is wirelessly energized causing a temperature of the film to increase.

According to the at least one example set forth above, the film comprises a plurality of conductive nano-structures.

According to the at least one example set forth above, the film comprises a plurality of organic silver (Ag) nano-wires.

According to the at least one example set forth above, the sensor is a camera sensor or a light detection and ranging (lidar) sensor, wherein a transmissivity of the film is greater than or equal to 95%.

According to the at least one example set forth above, wherein the housing further comprises a structure having a surface, wherein the transmitting coil is located near the surface, wherein the optic assembly further comprises: an axially extending base, and a flange, wherein the at least one receiving coil is located within or on the flange.

According to the at least one example set forth above, the optic assembly is couplable and decouplable with the structure, wherein in a coupled state, the surface is proximate to the flange.

According to the at least one example set forth above, wherein, when the transmitting coil is energized, the at least one receiving coil is within an electromagnetic field of the transmitting coil and also is energized.

According to the at least one example set forth above, the at least one receiving coil comprises a first coil and a second coil.

According to the at least one example set forth above, the film has a polarity, wherein a North polarity of the film is aligned with the first coil, wherein a South polarity of the film is aligned with the second coil.

According to the at least one example set forth above, the optic assembly further comprises an optical element.

According to the at least one example set forth above, the film is positioned over an outer surface of the optical element, wherein the optic assembly comprises a base and a flange that extends from the base and supports the optical element, wherein the at least one receiving coil is positioned at the flange.

According to the at least one example set forth above, the film and the at least one coil are coupled to the optical element and flange, respectively, via a low-pressure overmolding process.

According to the at least one example set forth above, the optic assembly further comprises a protective coating over the film and the at least one receiving coil.

According to the at least one example set forth above, the at least one receiving coil is positioned on both the flange and a portion of the base.

According to the at least one example set forth above, further comprising an active cooler, wherein the transmitting coil is electrically powered by the active cooler.

According to the at least one example set forth above, the optic assembly couplable and decouplable with respect to the housing via a threaded engagement.

According to the at least another illustrative example, a sensor is disclosed that comprises: a housing, comprising a transmitting coil; and an optic assembly, comprising: a body that supports an optical element; at least one receiving coil; and a transparent film over the optical element and electrically coupled to the at least one receiving coil, wherein, when the transmitting coil is energized, current flows within the film causing a temperature thereof to increase.

According to the at least one example, a method is disclosed that includes control of any of the system elements set forth above.

Figure 1:
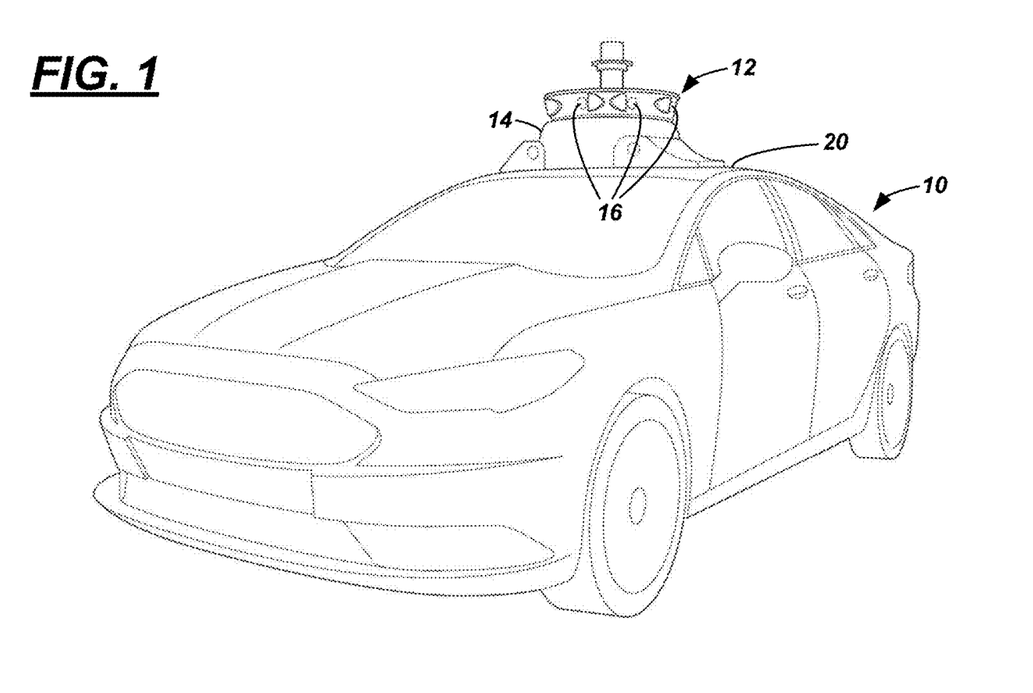
FIG. 1 is a perspective view of a vehicle comprising an imaging system that comprises a housing carrying one or more sensors.

Turning now to the figures wherein like reference numerals denote like or similar elements, features or functions, a vehicle 10 is shown that comprises an imaging system 12. In at least some examples, imaging system 12 may comprise a housing 14 supporting an array of sensors 16—e.g., directed radially outwardly to provide up to 360-degree situational awareness relative to vehicle 10. Each of the sensors 16 may comprise a thermal management system 18 (FIG. 2) that controls, among other things, a temperature of one or more components of the respective sensor 16. By using the thermal management system 18, the sensor 16 may be operational during extreme weather conditions (e.g., system 18 may assist in, among other things, a removal of ice and/or snow build-up from the sensor), as explained more below.

As shown in FIG. 1, vehicle 10 may be a passenger vehicle; however, vehicle 10 could be any other suitable vehicle type, including a truck, a sports utility vehicle (SUV), a recreational vehicle, a bus, aircraft, marine vessel, or the like that comprises the imaging system 12; further, non-vehicle systems could employ imaging system 12 as well. In the illustrated context, the imaging system 12 may be adapted to facilitate operation of vehicle 10 in one or more autonomous modes, as defined by the Society of Automotive Engineers (SAE) (which has defined operation at levels 0-5). For example, imaging system 12 may provide two- and/or three-dimensional data of its surroundings to a computer (not shown) which may be programmed and/or configured to store and execute logic instructions embodied in hardware, software, firmware, a combination thereof, or the like, and which enables vehicle 10 to operate with some user assistance (partial autonomy) or without any user assistance (full autonomy). For example, at levels 0-2, a human driver monitors or controls the majority of the driving tasks, often with no help from the vehicle 10. For example, at level 0 ("no automation"), a human driver is responsible for all vehicle operations. At level 1 ("driver assistance"), vehicle 10 sometimes assists with steering, acceleration, or braking, but the driver is still responsible for the vast majority of the vehicle control. At level 2 ("partial automation"), vehicle 10 can control steering, acceleration, and braking under certain circumstances without human interaction. At levels 3-5, vehicle 10 assumes more driving-related tasks. At level 3 ("conditional automation"), vehicle 10 can handle steering, acceleration, and braking under certain circumstances, as well as monitoring of the driving environment. Level 3 may require the driver to intervene occasionally, however. At level 4 ("high automation"), vehicle 10 can handle the same tasks as at level 3 but without relying on the driver to intervene in certain driving modes. At level 5 ("full automation"), vehicle 10 can handle all tasks without any driver intervention.

Housing 14 may be coupled to the vehicle 10 on a roof 20 thereof or at any other suitable location. The illustrated housing 14 may comprise any suitable structure to support the sensor(s) 16 and/or other features (e.g., such as a fluid delivery system suitable for delivering forced air and/or liquids to clean the sensor(s) 16 or the like). The illustrated housing 14 is merely one example. Other examples exist including those which comprise a single sensor 16, multiple sensors 16 arranged differently, etc. Further, housing 14 may support a variety of different kinds of sensors (e.g., color and/or black and white cameras, radar sensors, lidar sensors, etc.)

Figure 2:
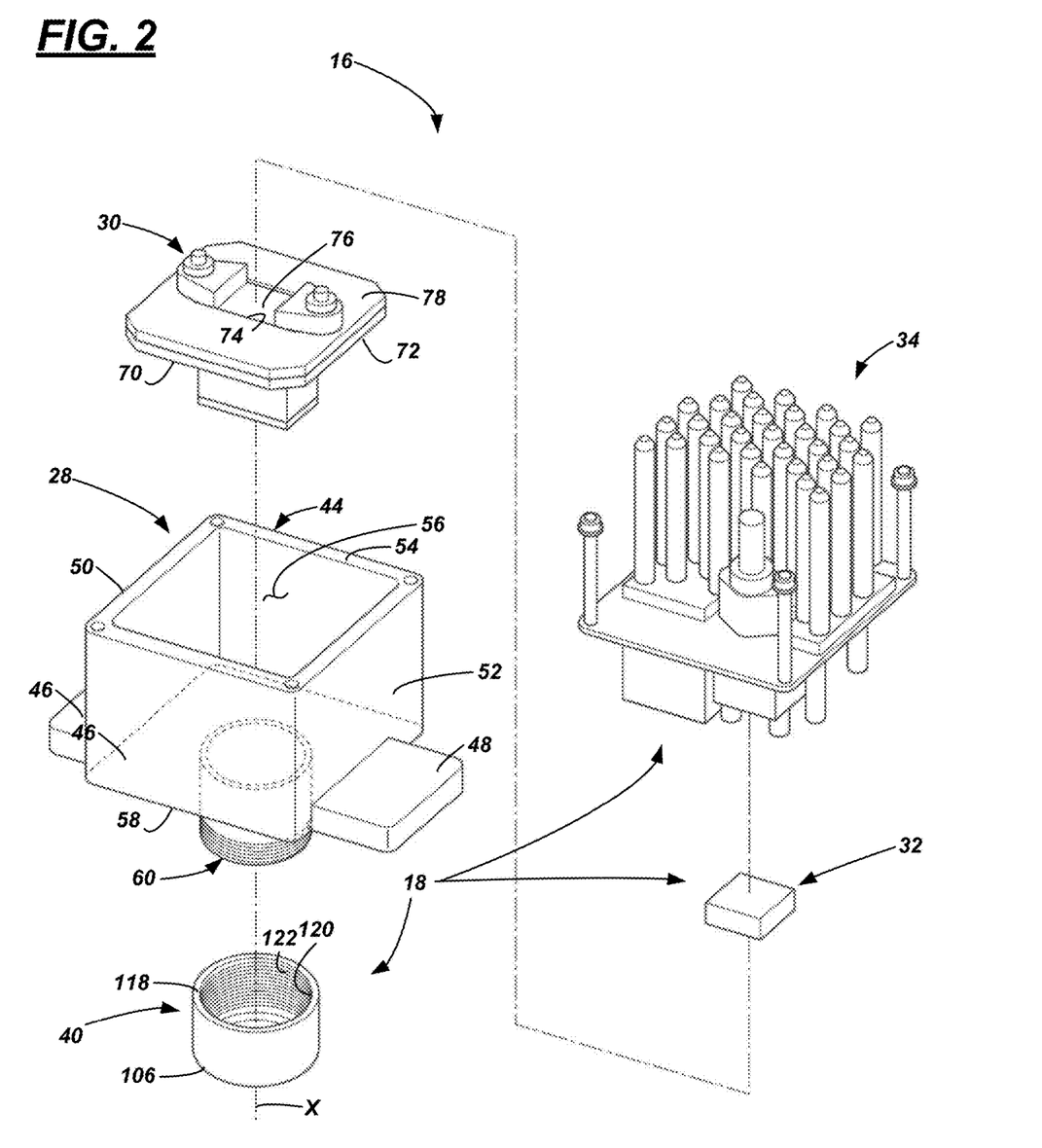
FIG. 2 is an exploded perspective view of a sensor, the sensor comprising a housing, a detector assembly, an active cooler, a heat exchanger, and an optic assembly.

Turning now to FIG. 2, an exploded view of an example sensor 16 is shown. It should be appreciated that in at least one example, each of the sensors 16 shown in FIG. 1 may be identical; therefore, only one sensor will be described in detail.

Sensor 16 is an imaging and/or ranging system that includes a signal-input component (e.g., such as a lens, a transparent window, a detector surface, etc.) for receiving light energy and/or a signal return (e.g., so that it may be received at a focal plane, a detector, or the like). In at least one example, sensor 16 is a camera (e.g., such as semiconductor charge-coupled devices (CCD), a complementary metal-oxide-semiconductor (CMOS), a N-type metal-oxide-semiconductor (NMOS), or the like) or an active scanning device (e.g., a light detection and ranging (LIDAR), a laser detection and ranging (LADAR), laser range finder (LRF), or the like). In the accompanying figures, sensor 16 is shown as a camera; however, it should be appreciated that this disclosure is not limited to camera implementations.

Sensor 16 may comprise a housing 28, a detector assembly 30, an active cooler 32, a heat exchanger 34, and an optic assembly 40, wherein the thermal management system 18 comprises the active cooler 32, the heat exchanger 34, and the optic assembly 40. Each will be discussed in detail.

Figures 3, 4:
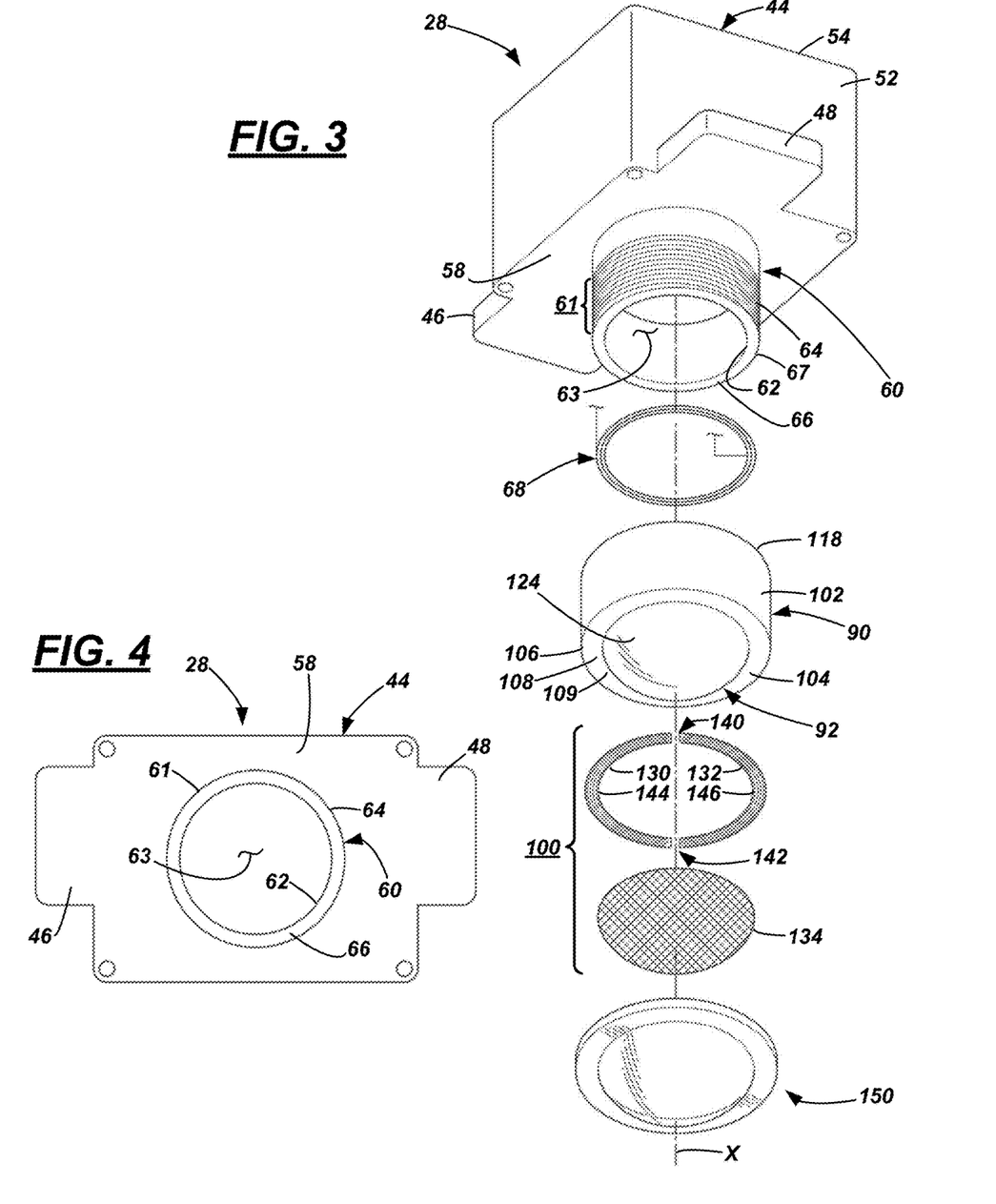
FIG. 3 is an exploded perspective view of the optic assembly shown in FIG. 2.
FIG. 4 is a front view of the housing shown in FIG. 2.

According to one example, housing 28 has a hollow body 44 that comprises a pair of flanges 46, 48, each extending from a respective side 50, 52 of the body 44 (e.g., the flanges 46, 48 may be configured to mount sensor 16 to a wall of housing 14). A first end 54 of the body 44 may have an opening to a cavity 56 that is sized to receive the detector assembly 30, the active cooler 32, and/or at least a portion of the heat exchanger 34. As also shown in FIGS. 3-4, a second end 58 of body 44 may comprise a structure 60 for mounting the optic assembly 40 (the structure may be comprised of non-conductive material). In at least some examples, structure 60 may protrude from second end 58; however, this is not required. According to a non-limiting example, structure 60 may have a cylindrical shape (e.g., or at least a cylindrical end region 61), wherein structure 60 has an opening 62 which defines a passage 63 which is in communication with cavity 56. End region 61 and/or other portions of structure 60 further may comprise a coupling feature 64 for coupling to optic assembly 40. Coupling feature 64 may facilitate a threaded engagement, a snap-fit engagement, an engagement utilizing screws or other fasteners, or the like. Thus, while in the figures feature 64 is shown as threads, this is merely an example.

According to the illustrated example, structure 60 includes a surface 66 (e.g., at a distal end 67 thereof) and at least one transmitting coil 68 (part of thermal management system 18) coupled to surface 66. Coil 68 may be surface-mounted to surface 66, at least partially embedded in surface 66 and/or near distal end 67, or the like. Coil 68 may be coupled to any suitable electronics of sensor 16; in at least one example, coil 68 is switchably electrically coupled to the active cooler 32 so that, when the active cooler 32 is powered (e.g., by a power source 69, FIG. 5), the coil 68 has a current passing therethrough (i.e., the coil 68 also is 'energized'). As will be explained in greater detail below, when coil 68 is in an active state (i.e., when electricity passes therethrough; e.g., when computer-controllable switches S1, S2 are actuated to respective closed states), the coil 68 may generate a magnetic flux.

Returning to FIG. 2, detector assembly 30 may comprise a detector 70 (e.g., an electronic imager or light receiver). Assembly 30 may comprise other elements as well—e.g., such as a printed circuit board (PCB), mounting features and hardware, a gasket, a thermal pad, and/or any other suitable component. Furthermore, it may be selectively coupled to power source 69 (via a different circuit by actuating a computer-controllable switch S3, shown in FIG. 5). Detector 70 may be located on one side 72 of the assembly 30, and a recess 74, comprising a major surface 76 (e.g., at the bottom of the recess 74), may be located on an opposite side 78 thereof.

Figure 6:
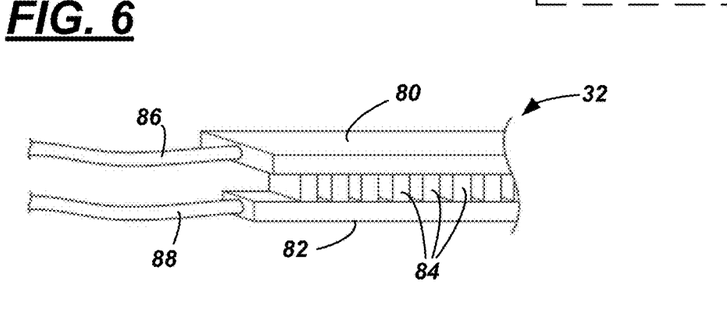
FIG. 6 is a perspective view of the active cooler shown in FIG. 2.

The recess 74 may be sized to receive the active cooler 32. As used herein, an active cooler is any electronically-actuated heat transfer device. Accordingly, it too may be coupled to power source 69. As shown in FIG. 6, active cooler 32 may comprise a hot plate 80, a cold plate 82, a plurality of conductors 84 coupling the plates 80, 82 to one another, and two connections 86, 88. One non-limiting example of active cooler 32 is a thermoelectric cooler (TEC) (also called a Peltier device, a Peltier heat pump, or a solid-state refrigerator) which utilizes the Peltier effect to create a heat flux between the hot and cold plates 80, 82. In one example, conductors 84 comprise thermoelectric materials (e.g., p-type conductors and n-type conductors). Connection 86 may be connected to the hot plate 80, and connection 88 may be connected to the cold plate 82. In operation, current flows through connection 86, through the hot plate 80, through the conductors 84, through the cold plate 82, and through connection 88. When current is flowing, heat moves from the cold plate 82 to the hot plate 80. Thus, in order to actively cool the detector 70, the cold plate 82 may be adjacent the major surface 76 (e.g., nearest detector 70).

Returning to FIG. 2, the heat exchanger 34 may be thermally coupled to the hot plate 80 of the active cooler 32. In this manner, heat may be transferred from the cooler 32 to the heat exchanger 34, and ultimately dissipated into the air. The heat exchanger 34 may be a passive device—e.g., such as a heat sink having fins, blades, protrusions, etc. to dissipate heat more efficiently. Other passive and even active heat exchangers are contemplated.

As shown in FIGS. 3-4 and 7-9, optic assembly 40 may comprise a body 90 (comprised of non-conductive material), at least one optical element 92 supported by the body 90, and a wireless heater system 100 (which may be part the thermal management system 18). According to one example, body 90 comprises an axially-extending base 102 that supports the optical element 92 in a fixed position (e.g., extending along an axis X). The base 102 may have any suitable shape—e.g., cylindrical, rectangular, oblong, or the like. In at least one example, the base 102 is shaped as an annulus. Furthermore, in some instances, such as those shown in the illustrations, the base 102 comprises a circumferential flange 104 that extends radially inwardly and is fixedly coupled to the optical element 92. In the illustrated example, the flange 104 is located at a first end 106 of the base 102; however, this is not required. Flange 104 may have an outer side 108 (having an outer surface 109) and an inner side 110 (having an inner surface 112) (best shown in exploded view (FIG. 3) and bottom view of optic assembly 40 (FIG. 8)). As will be explained in greater detail below, when the optic assembly 40 is assembled with housing 28, inner surface 112 may be located adjacent or near transmitting coil 68 (e.g., surface 112 may abut coil 68 and/or surface 66).

Figure 8:
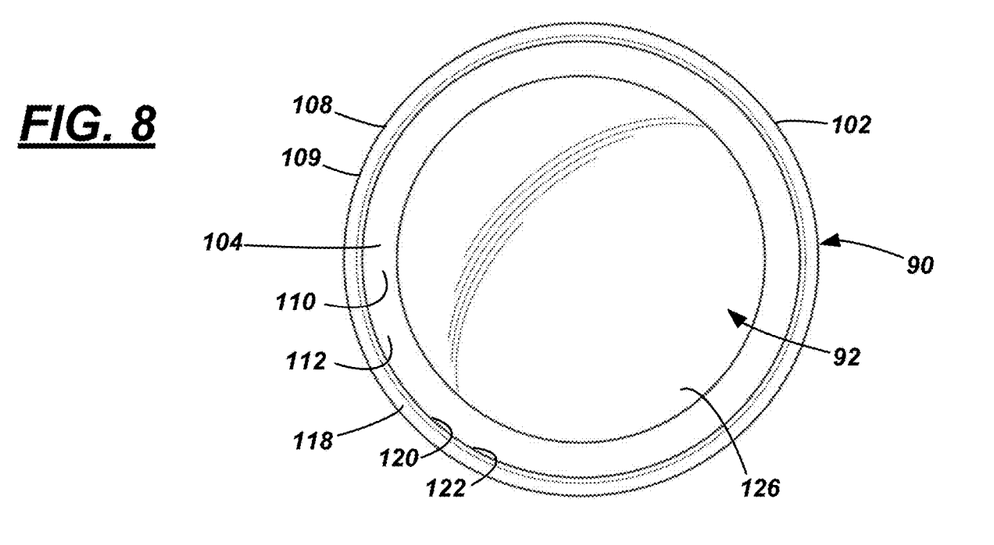
FIG. 8 is a bottom view of the optic assembly shown in FIG. 2.

A second end 118 of the base 102 may have a coupling feature 120 which may be configured to couple to coupling feature 64 (of housing 28) (FIGS. 2, 8). In the illustrated example, the coupling feature 120 is located on an inner surface 122 of base 102; however, this is not required in all examples. Coupling feature 120 may facilitate a threaded engagement, a snap-fit engagement, an engagement utilizing screws or other fasteners, or the like. Thus, while in the figures feature 120 is shown as threads which correspond with threads 64 (of housing 28), this is merely an example.

Optical element 92 may be a transparent material that permits light to pass therethrough; furthermore, in some examples (although not required), optical element 92 may filter light, magnify light, cause light rays to converge or diverge, or the like (e.g., toward the detector assembly 30). Thus, the optical element 92 may be a pass-through window (e.g., a transparent cover), a lens, or the like. In the illustrations, optical element 92 has a disk-like shape being convex on an outer side and concave on an inner side, wherein its circumferential edge is coupled to body 90; however, this is merely an example. A first major (outer) surface 124, a second major (inner) surface 126. And the optical element 92 may be comprised of any suitable material (e.g., glass, acrylic, etc.). Furthermore, while one optical element 92 is shown, base 102 may support more than one optical element 92 (e.g., within the body 90 thereof).

Figure 9:
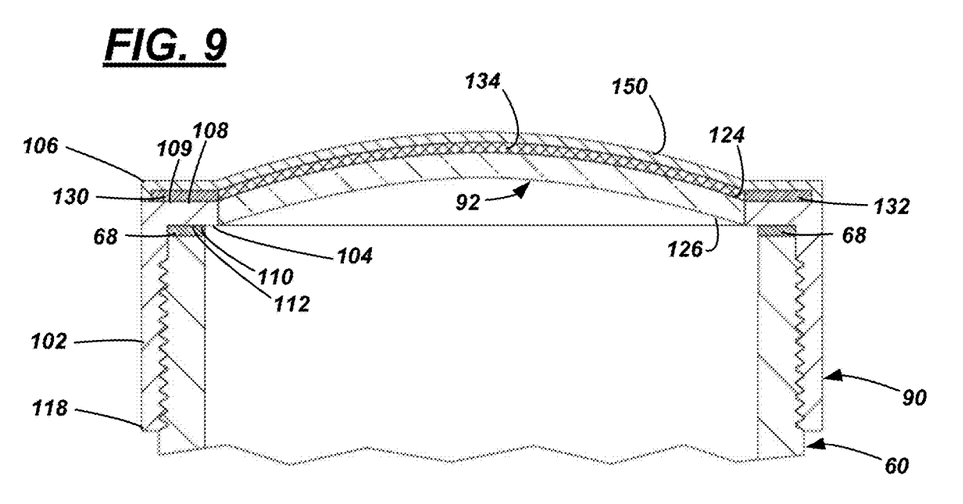
FIG. 9 is a sectional view of the optic assembly shown in FIG. 2.

Wireless heating system 100 may comprise at least one receiving coil (two semi-circular coils 130, 132 are shown by way of example) and a film 134. Each of coils 130, 132 may comprise a generally flat winding of one or more miniature wires (e.g., having a gauge size of 30-60 AWG); according to one example, a single wire is used per coil, and each respective end of the respective coil is electrically coupled to the film 134. As best shown in FIGS. 3 and 9, the coils 130, 132 may be located on outer surface 109 so that they partially circumferentially surround the optical element 92. (In other examples, coils 130, 132 may be at least partially embedded within outer surface 109.) Each coil 130, 132 may span between 176-179 degrees; accordingly, in the illustrated example, two gaps 140, 142 each may span 2-8 degrees.

Figure 7:
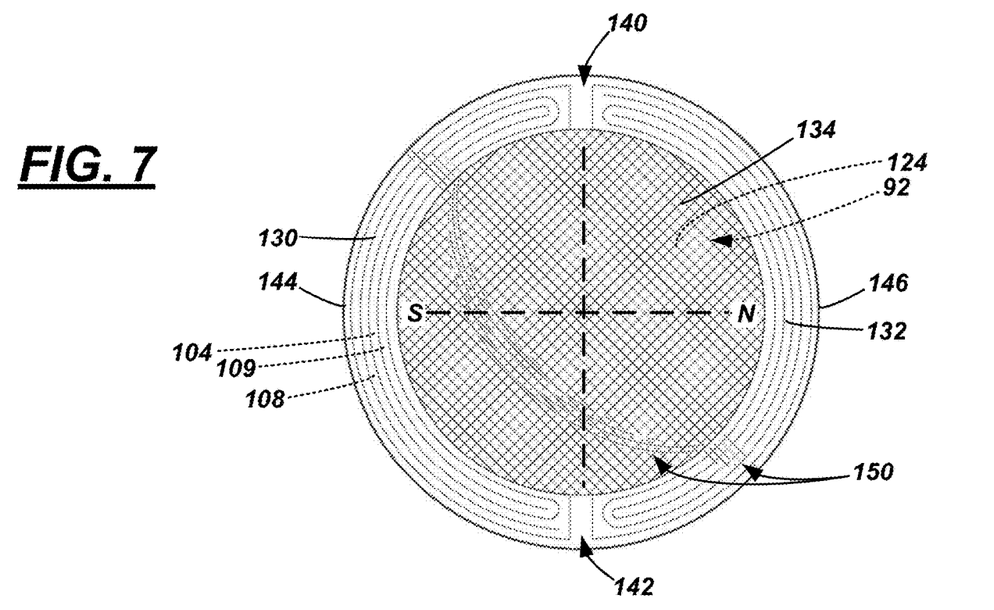
FIG. 7 is a top view of the optic assembly shown in FIG. 2.
Figure 10:
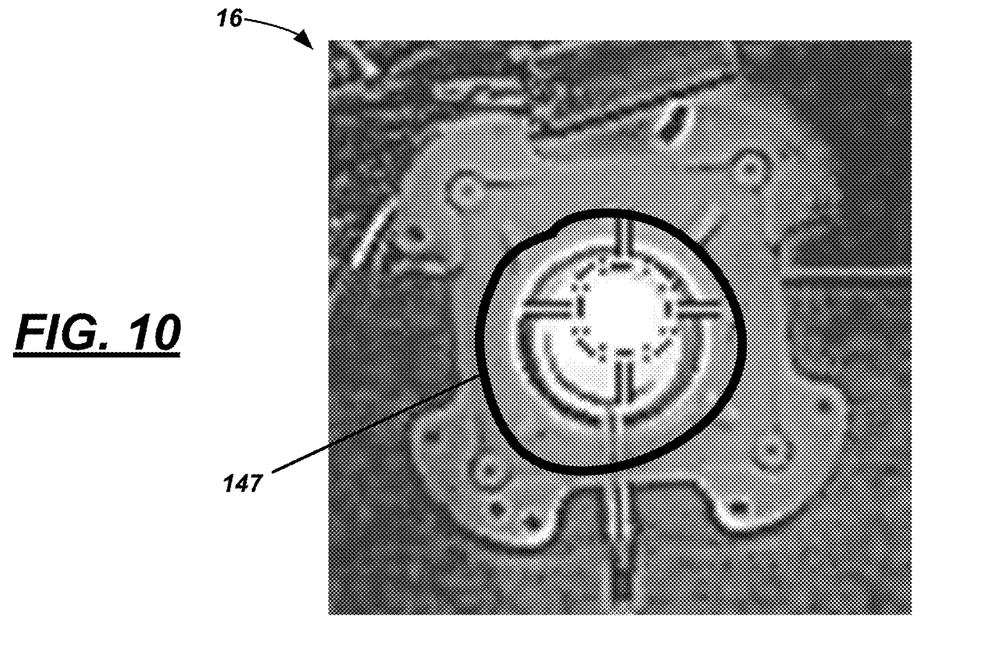
FIGS. 10-11 are example thermal images illustrating a heating distribution of the optic assembly.
Figure 11:
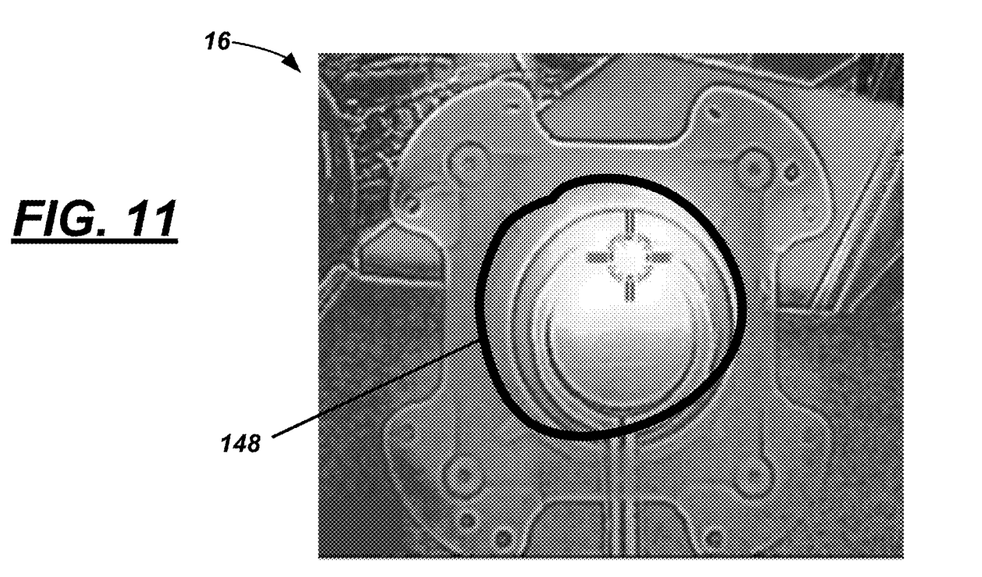

Film 134 may comprise a thin resistive film comprising a plurality of conductive nano-structures. In some examples, this film 134 may be transparent—e.g., having a high optical transmissivity (e.g., greater than or equal to 95%; e.g., greater than or equal to 97%; e.g., not reducing optical transmission (through the optical element 92) by more than 5%, and in some cases, not reducing optical transmission (through the optical element 92) by more than 3%). According to an example, the film 134 is an organic silver nano-wire film such as commercially-available NovaFilm AgNW-A50 provided Novarials Corporation™. Film 134 may be disk-shaped and may be positioned over outer surface 124 of optical element 92. Further, film 134 may abut or overlap coils 130, 132 so that it is in physical electrical contact therewith. In this manner, when coils 130, 132 have current passing therethrough (are 'energized'), film 134 may carry current(s) and act as a heating element—e.g., to warm the optical element 92 and melt ice, snow, etc. In at least some examples, the polarity of the film 134 is aligned with the two coils 130, 132; e.g., as best shown in FIG. 7, a South polarity S is aligned through a middle region 144 of coil 130 and a North polarity N is aligned with a middle region 146 of coil 132. (In another example, this may be reversed—e.g., N polarity aligned with coil 130 and S polarity aligned with coil 132). According to one example, the semi-circular coils 130, 132 (and gaps 140, 142), when energized, cause a substantially even electrical current distribution and consequently, a more even heating of optical element 92. For example, compare thermal imaging tests samples in FIGS. 10-11, wherein an example even heat distribution 147 of optical element 92 is shown in FIG. 10, and wherein an example uneven heat distribution 148 of the optical element 92 is shown in FIG. 11.

Wireless heating system 100 may be manufactured by aligning and fixing the optical element 92 in the body 90. Film 134 may be located on outer surface 124 of optical element 92, and coils 130, 132 may be positioned on outer surface 109 of flange 104 (e.g., as shown in FIG. 7), wherein coils 130, 132 are in electrical contact with film 134. The coils 130, 132 and film 134 may be adhered to the respective surfaces 109, 104 using any suitable optically clear adhesive. According to at least one example, both the coils 130, 132 and the film 134 may be fixed to body 90 using a low-pressure over-molding process (e.g., utilizing a low clamp pressure). Thereafter, an optically-clear protective coating 150 (as shown in FIGS. 3, 7) may be applied over the coils 130, 132 and film 134.

Once optic assembly 40 is assembled, it may be coupled to housing 28 using coupling features 64, 120. According to one example, optic assembly 40 may be threaded onto housing 28 until the surface 66 of structure 60 (and transmitting coil 68) is near or adjacent to inner surface 112 (of optic assembly 40). In this manner, transmitting coil 68 is proximate to coils 130, 132—e.g., spaced therefrom by a thickness of flange 104 (which may behave as a dielectric material; e.g., typically 2-8 millimeters). Thus, in at least one example, structure 60, transmitting coil 68, body 90, coils 130, 132, and film 134 may be aligned (e.g., along axis X). Still further, detector 70 may be located along the same optical axis—e.g., having line-of-sight via passage 63 and cavity 56.

Figure 5:
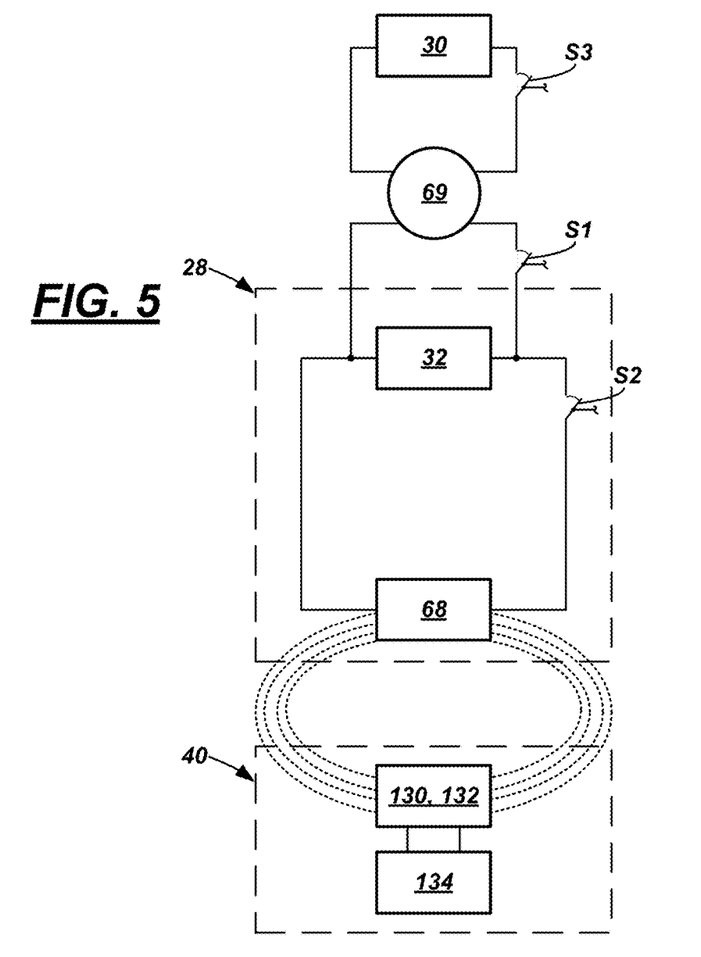
FIG. 5 is a schematic view of one example of an electrical circuit of the sensor.

In operation, a computer (not shown) of the sensor 16 and/or vehicle 10 may operate the sensor 16. For example, as shown in FIG. 5, power source 69 may provide power to detector assembly 30 (e.g., by closing switch S3) and sensor 16 may gather sensor data. When sensor 16 exceeds a threshold temperature, the computer may move switch S1 from an open state to a closed state, and consequently, power source 69 may provide power concurrently to active cooler 32. Similar, when sensor 16 falls below a threshold temperature (or the computer determines an ice or snow obstruction on the optical element 92), then optical element 92 may be warmed using the wireless heating system 100. According to the example shown in FIG. 5, when switches S1 and S2 are in a closed state, electrical current may be provided to transmitting coil 68 which in turn generates a magnetic flux. Since the coils 130, 132 are in sufficient proximity to coil 68, the magnetic flux generated by coil 68 may induce electrical current(s) in coils 130, 132. And since the coils 130, 132 are coupled to the film 134, as described above, the conductive film 134 receives current and increases in temperature thereby generating heat which warms the optical element 92. With sufficient heat, this may melt snow, ice, or the like thereby permitting the sensor 16 to gather data which is less distorted by obstructions on the optical element 92.

In other examples, sensor 16 may utilize electrical fields, magnetic fields, or a combination thereof (e.g., an electromagnetic field). Furthermore, in some examples (not shown), electrical current may be provided to transmitting coil 68 without using switch S2 (or any of the other switches) and/or using different electrical circuit arrangements. Further, switches S1, S2, S3 may be suitable type of switch—e.g., including transistors, MOSFETs, etc.

Figure 12:
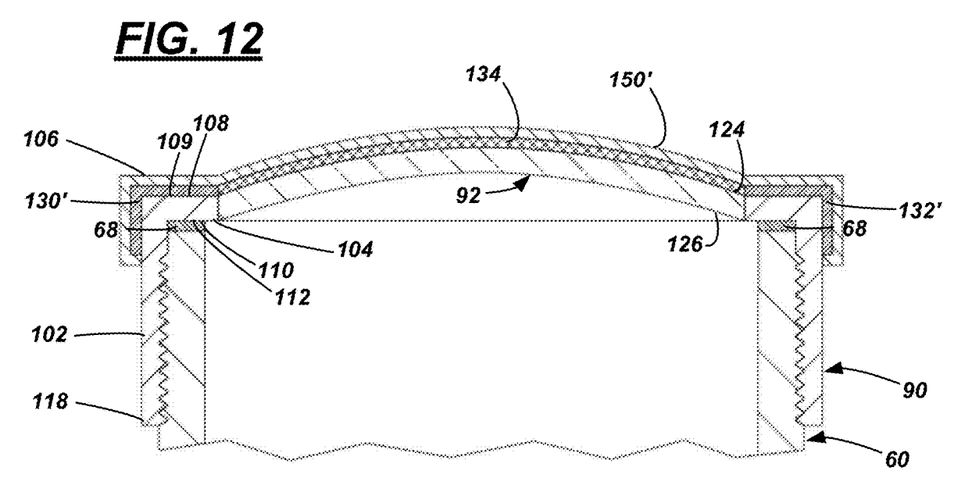
FIG. 12 is a sectional view of another example of an optic assembly.

Still other examples of the sensor 16 exist as well. For example, the wireless heating system 100 may have a different arrangement. For example, as shown in FIG. 12, wherein like numerals are provided to show like or identical features and functions, coils 130', 132' are used which may wrap around a portion of body 90 (e.g., around a portion of base 102)—e.g., at or near first end 106. Similarly, protective coating 150' also may wrap around a portion of body 90 as well. In this arrangement, a larger electrical current may be induced in coils 130', 132'—consequently, a larger current may be induced in film 134 resulting in a greater resistive value and more heat dissipation to optical element 92.

Thus, there has been described a sensor having a thermal management system. For example, the sensor may have an optic assembly that comprises a wireless heating system that may operate in conjunction with other aspects of the thermal management system—e.g., which may be located in other parts of the sensor. According to an example, the wireless heating system comprises at least one coil and a conductive film in electrical contact with the coil so that when electrical current is wirelessly induced in the at least one coil, the film has electricity moving therein and warms the optical element.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A sensor, comprising:
a housing, comprising a transmitting coil; and
an optic assembly, comprising a body supporting a first semi-circular receiving coil, a second semi-circular receiving coil, and a conductive film that is in electrical contact with the first and second semi-circular receiving coils;
wherein, when the transmitting coil is energized, the first and second semi-circular receiving coils are wirelessly energized causing a temperature of the film to increase;
wherein the film has a polarity;
wherein a first polarity of the film is aligned with a middle region of the first semi-circular coil; and
wherein a second polarity of the film is aligned with a middle region of the semi-circular second coil.

2. The sensor of claim 1, wherein the film comprises a plurality of conductive nano-structures.

3. The sensor of claim 1, wherein the film comprises a plurality of organic silver (Ag) nano-wires.

4. The sensor of claim 1, wherein the sensor is a camera sensor or a light detection and ranging (lidar) sensor, wherein a transmissivity of the film is greater than or equal to 95%.

5. The sensor of claim 1,
wherein the housing further comprises a structure having a surface, wherein the transmitting coil is located near the surface;
wherein the optic assembly further comprises:
an axially extending base; and
a flange, wherein the first and second semi-circular receiving coils are located within or on the flange.

6. The sensor of claim 5, wherein the optic assembly is couplable and decouplable with the structure, wherein in a coupled state, the surface is proximate to the flange.

7. The sensor of claim 5, wherein, when the transmitting coil is energized, the first and second semi-circular receiving coils are within an electromagnetic field of the transmitting coil.

8. The sensor of claim 1, wherein the optic assembly further comprises an optical element.

9. The sensor of claim 8, wherein the film is positioned over an outer surface of the optical element, wherein the optic assembly comprises a base and a flange that extends from the base and supports the optical element, wherein the first and second semi-circular receiving coils are positioned at the flange.

10. The sensor of claim 9, wherein the film and the first and second semi-circular receiving coils are coupled to the optical element and flange, respectively, via a low-pressure over-molding process.

11. The sensor of claim 9, wherein the optic assembly further comprises a protective coating over the film and the first and second semi-circular receiving coils.

12. The sensor of claim 9, wherein the first and second semi-circular receiving coils are positioned on both the flange and a portion of the base.

13. The sensor of claim 1, further comprising an active cooler, wherein the transmitting coil is electrically powered by the active cooler.

14. The sensor of claim 1, wherein the optic assembly is couplable and decouplable with respect to the housing via a threaded engagement.

15. The sensor of claim 1, wherein the first and second semi-circular receiving coils have arcs of less than or equal to 179 degrees.

16. A sensor, comprising:
- a housing, comprising a transmitting coil; and
- an optic assembly, comprising:
  - a body that supports an optical element;
  - a first semi-circular receiving coil and second semi-circular receiving coil; and
  - a transparent film over the optical element and electrically coupled to the first and second semi-circular receiving coils;
- wherein, when the transmitting coil is energized, current flows within the film causing a temperature thereof to increase;
- wherein the film has a polarity;
- wherein a first polarity of the transparent film is aligned with a middle region of the first semi-circular coil; and
- wherein a second polarity of the transparent film is aligned with a middle region of the semi-circular second coil.

* * * * *